US012720672B2

(12) United States Patent
Chang

(10) Patent No.: US 12,720,672 B2
(45) Date of Patent: Aug. 25, 2026

(54) ELECTRONIC DEVICES

(71) Applicant: Advanced Semiconductor Engineering, Inc., Kaohsiung (TW)

(72) Inventor: Wei-Tung Chang, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 220 days.

(21) Appl. No.: 18/435,988

(22) Filed: Feb. 7, 2024

(65) Prior Publication Data

US 2025/0254789 A1 Aug. 7, 2025

(51) Int. Cl.

| | |
|---|---|
| ***H05K 1/18*** | (2026.01) |
| ***H05K 1/02*** | (2006.01) |
| ***H05K 1/181*** | (2026.01) |
| ***H05K 7/20*** | (2006.01) |

(52) U.S. Cl.

CPC ......... *H05K 1/0268* (2013.01); *H05K 1/0277* (2013.01); *H05K 1/181* (2013.01); *H05K 7/2039* (2013.01); *H05K 2201/10098* (2013.01)

(58) Field of Classification Search

CPC .... H05K 1/0268; H05K 1/0277; H05K 1/181; H05K 7/2039; H05K 2201/10098

USPC ........................................................ 361/749

See application file for complete search history.

(56) References Cited

U.S. PATENT DOCUMENTS

| | | | | |
|---|---|---|---|---|
| 11,165,136 | B2 | 11/2021 | Ou et al. | |
| 11,335,991 | B2 | 5/2022 | Kim et al. | |
| 2020/0112081 | A1* | 4/2020 | Kim | H05K 1/148 |
| 2020/0395675 | A1* | 12/2020 | Han | H01Q 9/0414 |
| 2021/0345492 | A1* | 11/2021 | Yeon | H05K 1/189 |
| 2022/0006486 | A1 | 1/2022 | Rajagopalan et al. | |
| 2022/0130776 | A1* | 4/2022 | Lu | H01L 23/4985 |
| 2022/0373670 | A1* | 11/2022 | Yu | H01Q 21/065 |

* cited by examiner

*Primary Examiner* — Binh B Tran

(74) *Attorney, Agent, or Firm* — Foley and Lardner LLP

(57) ABSTRACT

The present disclosure provides an electronic device. The electronic device includes a carrier, an electronic component, a first antenna, and a conductive element. The carrier has a first surface and a second surface opposite to the first surface. The electronic component abuts the second surface. The first antenna is connected with the carrier. The conductive element abuts the first surface of the carrier and configured to test the first antenna.

20 Claims, 15 Drawing Sheets

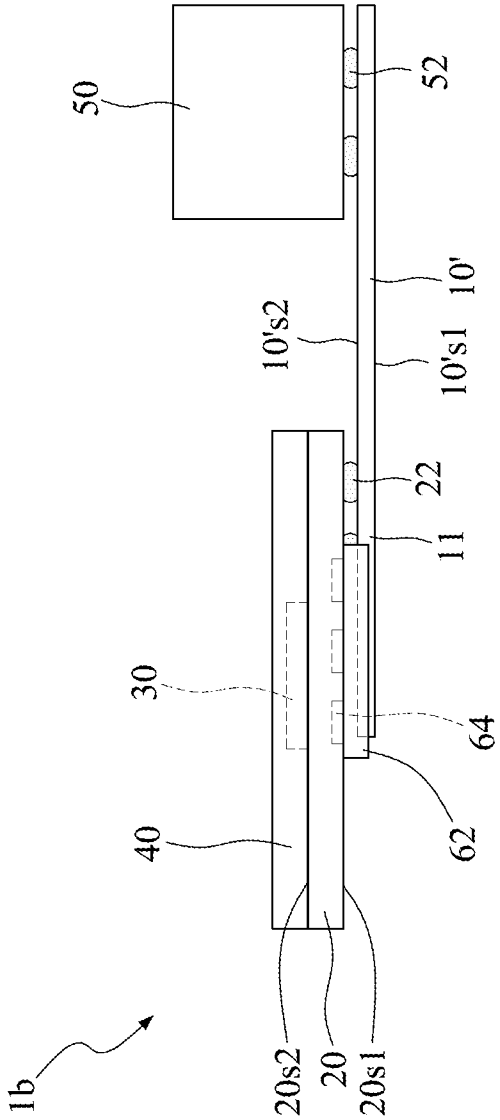
FIG. 2
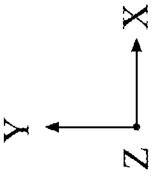

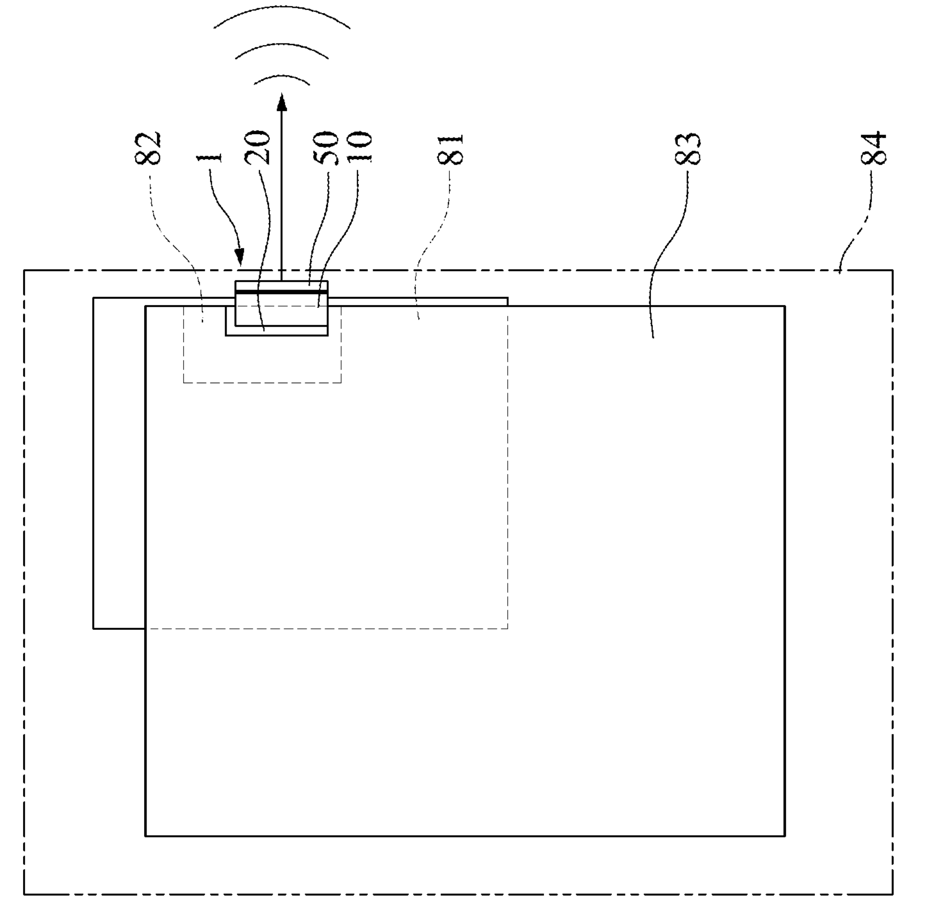
FIG. 7A
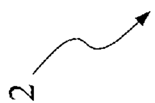

ELECTRONIC DEVICES

BACKGROUND

1. Field of the Disclosure

The present disclosure generally relates to an electronic device, and in particular, to an electronic device including an antenna and a test pad configured to test the electronic device in electrical properties.

2. Description of the Related Art

To reduce the size and achieve higher integration of electronic devices, several packaging solutions have been developed and implemented, such as antenna in package (AiP) and antenna on package (AoP). However, to support the industry's demand for increased electronic functionality, the size and/or form factor of the electronic devices will inevitably be increased.

SUMMARY

In some arrangements, an electronic device includes a carrier, an electronic component, a first antenna, and a conductive element. The carrier has a first surface and a second surface opposite to the first surface. The electronic component abuts the second surface. The first antenna is connected with the carrier. The conductive element abuts the first surface of the carrier and configured to test the first antenna.

In some arrangements, an electronic device includes a carrier, a flexible circuit structure, a connector, and a first antenna. The flexible circuit structure is disposed over the carrier. The first antenna is connected to the flexible circuit structure. The connector is disposed over the carrier and electrically connected to the first antenna by the flexible circuit structure. The connector is configured to connect an external device to the carrier.

In some arrangements, an electronic device includes a carrier, an electronic component, a connector, and a bendable circuit layer. The electronic component is disposed under the carrier. The connector is disposed over the carrier and configured to connect the carrier to an external device. The bendable circuit layer connects an antenna to the carrier and is spaced apart from the connector.

BRIEF DESCRIPTION OF THE DRAWINGS

Aspects of some arrangements of the present disclosure are best understood from the following detailed description when read with the accompanying figures. It is noted that various structures may not be drawn to scale, and dimensions of the various structures may be arbitrarily increased or reduced for clarity of discussion.

FIG. 2 illustrates a side view of an electronic device, in accordance with some arrangements of the present disclosure.

FIG. 7A illustrates a layout of an electronic device, in accordance with some arrangements of the present disclosure.

DETAILED DESCRIPTION

Figure 1A:
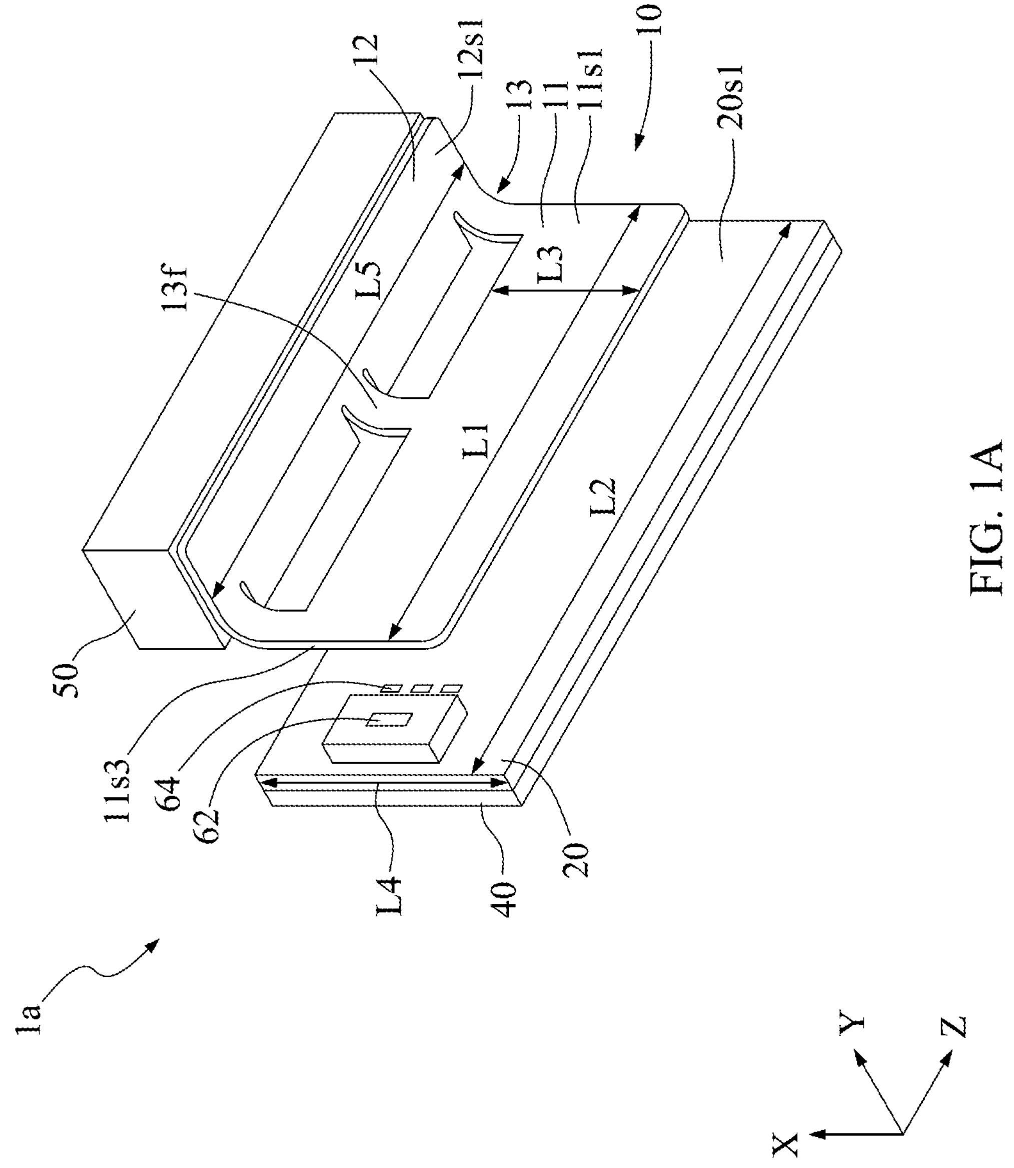
FIG. 1A and FIG. 1B illustrate perspective views of an electronic device, in accordance with some arrangements of the present disclosure.

Common reference numerals are used throughout the drawings and the detailed description to indicate the same or similar components. Arrangements of the present disclosure will be readily understood from the following detailed description taken in conjunction with the accompanying drawings.

The following disclosure provides many different arrangements, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include arrangements in which the first and second features are formed or disposed in direct contact, and may also include arrangements in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various arrangements and/or configurations discussed.

Figure 1B:
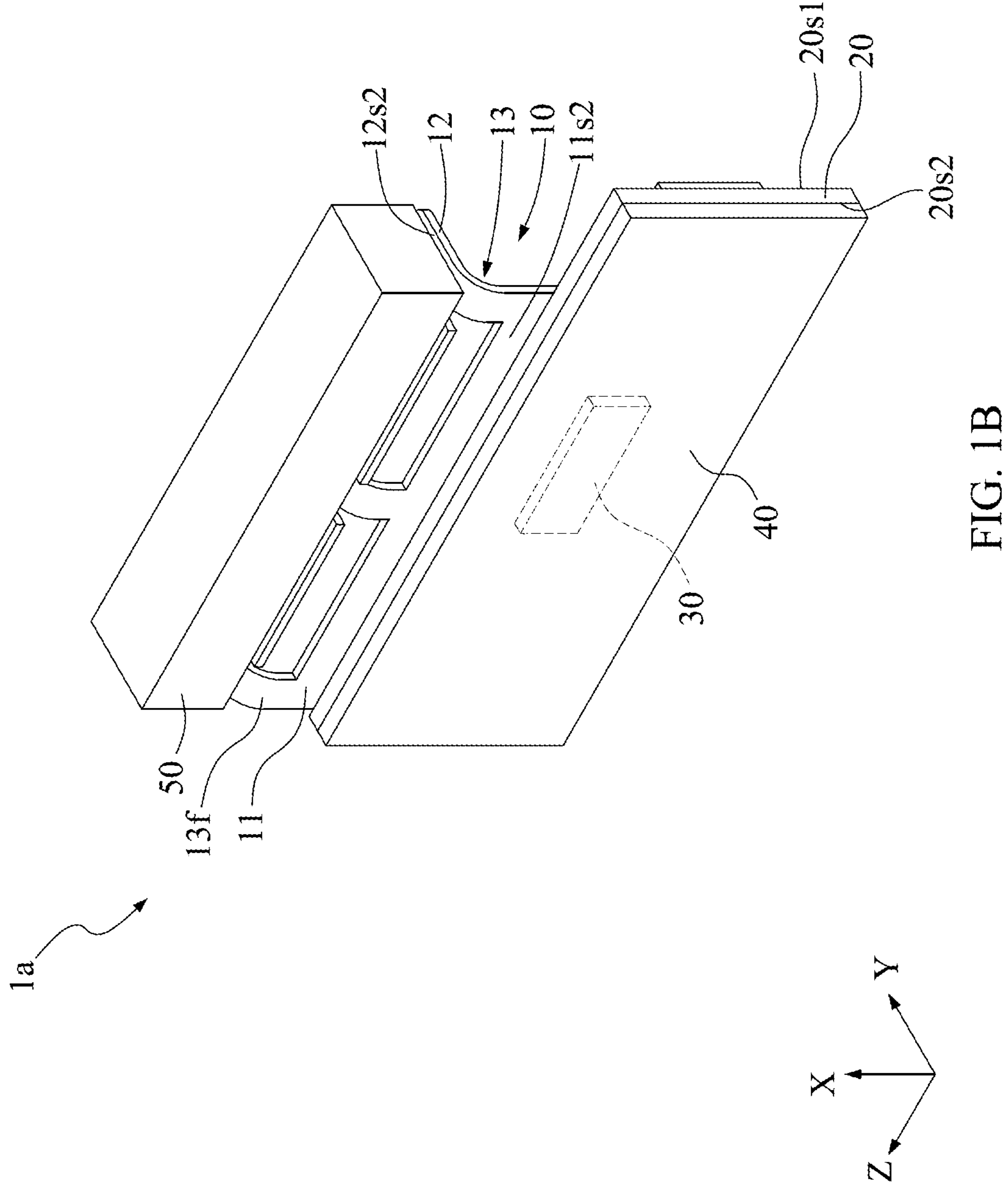

FIG. 1A and FIG. 1B illustrate perspective views, from different angles of view, of an electronic device 1*a*, in accordance with some arrangements of the present disclosure. In some arrangements, the electronic device 1*a* may be configured to be operated with electromagnetic waves or electromagnetic signals at appropriate radio wavelengths, such as microwave, millimeter wave, or submillimeter wave. In some arrangements, the electronic device 1*a* may include a circuit structure 10, a carrier 20, an electronic component 30 (shown in FIG. 1B), an encapsulant 40, and an antenna component 50.

The circuit structure 10 may include a circuit board, which includes a redistribution structure for electrical connection between components. For example, the circuit structure 10 may include a conductive layer(s), conductive trace (s), conductive pad(s), and/or conductive via(s) for electrical connection. In some arrangements, the circuit structure 10 may include a flexible circuit structure, a bendable circuit structure, or other suitable circuit structures. The circuit structure 10 may include polyethylene terephthalate (PET), polyethylene naphthalate (PEN), polyimide, liquid crystal polymer (LCP), thermoplastic polyurethane (TPU), or other suitable materials. The circuit structure 10 may include a multi-layered structure, which includes dielectric layers and electrical interconnections (e.g., conductive layer, conductive trace, conductive pad, and conductive via) disposed on and/or within the dielectric layers.

In some arrangements, the circuit structure 10 may include an extending portion 11, an extending portion 12, and a bent portion 13 to define a bent circuit structure. The extending portion 11 may extend along the X direction and the Z direction, which span a plane substantially parallel to the X-Z plane. For example, the long edge (or long side) of the extending portion 11 may substantially extend along the Z direction, while the short edge (or short side) of the extending portion 11 substantially extends along the X direction. The extending portion 11 may have a surface 11*s*1 and a surface 11*s*2 opposite to the surface 11*s*1. In some arrangements, the surface 11*s*2 of the extending portion 11 may be configured to support the carrier 20. In some arrangements, the surface 11*s*2 of the extending portion 11 may be configured to support the electronic component 30.

In some arrangements, the extending portion 12 may be connected to the extending portion 11 by the bent portion 13. The extending portion 12 may extend along the Y direction and the Z direction, which span a plane substantially parallel to the Y-Z plane. For example, the long edge (or long side) of the extending portion 12 substantially extends along the Z direction, while the short edge (or short side) of the extending portion 12 substantially extends along the Y direction. The extending portion 12 may have a surface 12*s*1 and a surface 12*s*2 opposite to the surface 12*s*1. In some arrangements, the surface 12*s*2 of the extending portion 12 may be configured to support the antenna component 50. In some arrangements, the surface area (e.g., the surface area of the surface 12*s*1) of the extending portion 12 is less than the surface area (e.g., the surface area of the surface 11*s*1) of the extending portion 11.

The bent portion 13 may extend between the extending portion 11 and extending portion 12. In some arrangements, the bent portion 13 may include two or more fingers 13*f* which are bent. In some arrangements, the finger 13*f* defines a curved surface connecting the extending portion 11 and extending portion 12. In some arrangements, the extending portion 11, extending portion 12, and bent portion 13 may be formed as one piece. That is, the extending portion 11, extending portion 12, and bent portion 13 include or are made of the same material with no obvious boundary among them. The bent portion 13 allows the extending portion 12 to extend further away from the carrier 20.

In some arrangements, the carrier 20 may be disposed on or under the surface 11*s*2 of the extending portion 11. The carrier 20 may be attached to the surface 11*s*2 of the extending portion 11. The carrier 20 may extend along the X direction and the Z direction, which span a plane substantially parallel to the X-Z plane. For example, the long edge (or long side) of the carrier 20 may substantially extend along the Z direction, while the short edge (or short side) of the carrier 20 substantially extends along the X direction. The carrier 20 may be formed of, for example, a printed circuit board, such as a paper-based copper foil laminate, a composite copper foil laminate, or a polymer-impregnated glass-fiber-based copper foil laminate. The carrier 20 may include a redistribution structure, which includes a conductive layer(s), conductive trace(s), conductive pad(s), and/or conductive via(s) disposed on or within one or more dielectric layers. The carrier 20 may be electrically connected to the circuit structure 10. The carrier 20 may have a surface 20*s*1 and a surface 20*s*2 opposite to the surface 20*s*1. The surface 20*s*1 may face or abut the surface 11*s*2 of the extending portion 11.

In some arrangements, the surface area of the surface 20*s*1 of the carrier 20 may be greater than the surface area of the surface 11*s*1 of the extending portion 11. The extending portion 11 may have a length L1 along the Z direction. The carrier 20 may have a length L2 along the Z direction. In some arrangements, the length L2 of the carrier 20 may be greater than the length L1 of the extending portion 11. The extending portion 11 may have a length L3 along the X direction. The carrier 20 may have a length L4 along the X direction. In some arrangements, the length L4 of the carrier 20 may be greater than the length L3 of the extending portion 11. In some arrangements, a portion of the surface 20*s*1 may be exposed by the extending portion 11. In some arrangements, a portion of the surface 11*s*2 of the extending portion 11 may be exposed by the carrier 20 or electronic component 30 as shown in FIG. 1B. In some arrangements, a portion of the short edge of the extending portion 11 may exceed the short edge of the carrier 20. The long edge of the extending portion 12 may have a length L5 along the Z direction. In some arrangements, the length L5 of the extending portion 12 may be less than the length L2 of the carrier 20. In some arrangements, the length L5 of the extending portion 12 may be substantially equal to the length L1 of the extending portion 11.

In some arrangements, the electronic component 30 may be disposed on or under the surface 20*s*2 of the carrier 20. The electronic component 30 may be disposed on or under the surface 11*s*2 of the extending portion 11. The electronic component 30 may include a semiconductor die or a chip, such as a logic die (e.g., application processor (AP), system-on-a-chip (SoC), central processing unit (CPU), graphics processing unit (GPU), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies) or other active components. In some arrangements, the electronic component 30 may include an analog-to-digital (A/D) converter, a digital-to-analog (D/A) converter, a filter, a low noise amplifier (LNA), a power amplifier, a multiplexer, a demultiplexer, a modulator, a demodulator, and so on. In some arrangements, the electronic component 30 may be configured to transmit, receive, and/or process a signal (e.g., a feeding signal, an input signal, an output signal, or an electromagnetic wave) to and/or from the antenna component 50.

In some arrangements, the encapsulant 40 may be disposed on or under the surface **20*s*2 of the carrier 20. The encapsulant 40 may be disposed on or under the surface 11*s*2 of the extending portion 11. In some arrangements, the encapsulant 40 may encapsulate or cover the electronic component 30. In some arrangements, the encapsulant 40** may include or be made of molding material that may include, for example, a novolac-based resin, an epoxy-based resin, a silicone-based resin, or other another suitable encapsulant. Suitable fillers may also be included, such as powdered $SiO_2$.

In some arrangements, the antenna component 50 may be disposed on the surface **12*s*2 of the extending portion 12. The antenna component 50 may be attached to the surface 12*s*2 of the extending portion 12. The antenna component 50 may be electrically connected to the electronic component 30 through the circuit structure 10 and the carrier 20. In some arrangements, the antenna component 50 may be configured to radiate and/or receive electromagnetic signals, such as radio frequency (RF) signals. For example, the antenna component 50 may be configured to operate in a frequency between about 10 GHz and about 10 THz, such as 10 GHz, 50 GHz, 100 GHz, 500 GHz, 1000 GHz, 5000 GHz, or 10 THz. In some arrangements, the antenna component 50 may support fifth generation (5G) communications, such as Sub-6 GHz frequency bands and/or millimeter (mm) wave frequency bands. For example, the antenna component 50 may incorporate both Sub-6 GHz antennas and mm wave antennas. In some arrangements, the antenna component 50 may support beyond-5G or 6G communications, such as terahertz (THz) frequency bands. In some arrangements, the antenna component 50 may include loop antennas, inverted-F antennas, strip antennas, planar inverted-F antennas, patch antennas, slot antennas, hybrid antennas that include antenna structures of more than one type, or other suitable antennas. In some arrangements, the antenna component 50 may include a dielectric resonator antenna (DRA). In some arrangements, the antenna component 50 may be detachable. For example, the antenna component 50 may be separated from the circuit structure 10. In some arrangements, the antenna patches, radiators, directors, and/or other components of the antenna component 50, which include metal materials, are not formed on or within the circuit structure 10. In this condition, the radiation of the signal may be easily controlled. In some arrangements, the antenna component 50 may include multiple antennas operated at different frequencies. Said antennas may be stacked. For example, the antenna operated at a lower frequency is closer to the circuit structure 10** than the antenna operated at a higher frequency is.

In some arrangements, the electronic device **1*a* may further include a connector 62. The connector 62 may be disposed on or over the surface 20*s*1 of the carrier 20. The connector 62 may be supported by or attached to the carrier 20. In some arrangements, the antenna component 50 and the connector 62 may be disposed on adjacent sides or surfaces of the circuit structure 10. For example, the connector 62 may abut the surface 11*s*3, extending between the surface 11*s*1 and surface 11*s*2, of the extending portion 11 and face the Y direction, while the antenna component 50 is disposed on the surface 12*s*2 of the extending portion 12 and faces the X direction. The connector 62 may be configured to electrically connect the electronic device 1*a* and an external device (not shown), such as a circuit board or other suitable components. In some arrangements, the connector 62 may abut the extending portion 11. For example, the connector 62 may be disposed adjacent to the lateral surface (not annotated) of the extending portion 11. The connector 62 may be electrically connected to the carrier 20. The connector 62 may be electrically connected to the electronic component 30. In some arrangements, the connector 62 may be exposed by the extending portion 11. In some arrangements, the connector 62 may be free from overlapping the extending portion 11 along the Y direction. In some arrangements, the connector 62 may be free from overlapping the extending portion 12 along the Y direction. The connector 62 may cover the portion of the carrier 20 which is exposed by the circuit structure 10**.

In some arrangements, the electronic device **1*a* may further include conductive elements 64. A portion of the conductive element 64 may be embedded within the carrier 20. The conductive element 64 may be disposed on or over the surface 20*s*1 of the carrier 20. In some arrangements, the antenna component 50 and the conductive element 64 may be disposed on adjacent sides or surfaces of the circuit structure 10. For example, the conductive element 64 may abut the surface 11*s*3 and faces the Y direction, while the antenna component 50 is disposed on the surface 12*s*2 of the extending portion 12 and faces the X direction. In some arrangements, the conductive element 64 is free from overlapping the circuit structure 10. In some arrangements, the conductive element 64 is free from overlapping the extending portion 11 of the circuit structure 10. In some arrangements, the conductive element 64 is free from overlapping the extending portion 12 of the circuit structure 10. The conductive element 64 may be configured to be electrically connected to the electronic component 30 and/or the antenna component 50 for testing. For example, the conductive element 64 may be configured to measure electrical properties, such as the gain of antenna, the impedance, or other properties, of the electronic device 1*a*. In some arrangements, the conductive element 64 may be disposed adjacent to the connector 62 so that the electrical properties of electrical signals transmitted between the connector 62 and the antenna component 50 can be closer to the measured electrical properties of electrical signals transmitted between the conductive element 64 and the antenna component 50. Therefore, the measured electrical properties from the conductive element 64 can be relatively precise. In some arrangements, the electrical transmission path between the conductive element 64 and the antenna component 50 may be substantially the same as or closer to that between the connector 62 and the antenna component 50. The electrical transmission path may indicate a path of an electrical signal. In some arrangements, the conductive element 64 may be disposed between the extending portion 11 and the connector 62**.

In this arrangement, the conductive element 64 (e.g., test pad) and the electronic component 30 (or encapsulant 40) are disposed at different sides of the carrier 20. Further, the conductive element 64 and the antenna component 50 are disposed at adjacent sides. Therefore, a probe can be connected to the conductive element 64 without obstacles, such as encapsulant, antenna, and/or other components. Further, the conductive element 64 is disposed at the side (or lateral surface) of the carrier 20, which thereby provides greater space for integration of the electronic device **1*a*** and other external devices, such as a circuit board.

Figure 1C:
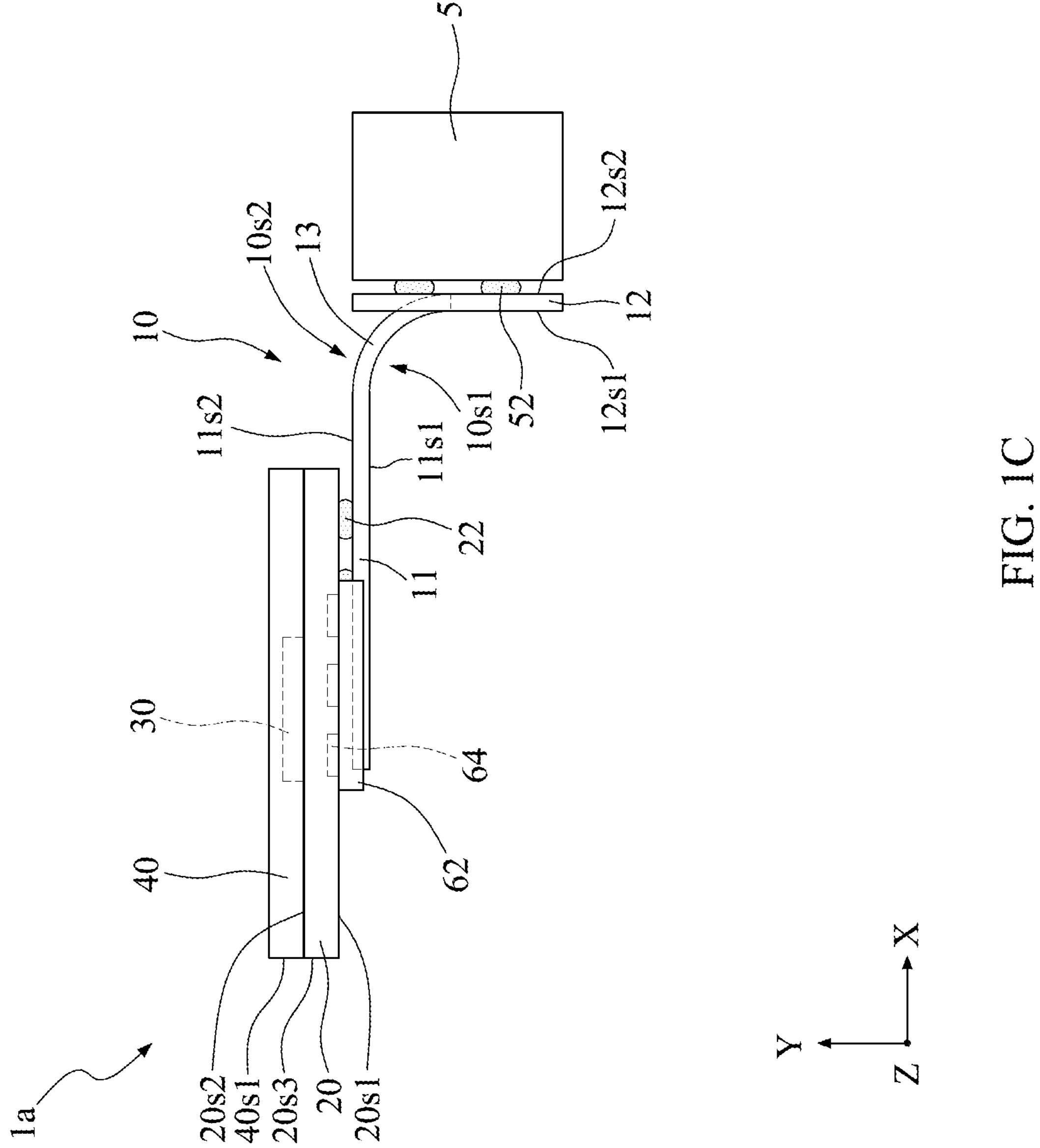
FIG. 1C illustrates a side view of the electronic device as shown in FIG. 1A and FIG. 1B, in accordance with some arrangements of the present disclosure.

FIG. 1C illustrates a side view of the electronic device **1*a* as shown in FIG. 1A and FIG. 1**B, in accordance with some arrangements of the present disclosure.

The electronic device 1*a* may further include electrical connectors 22. The electrical connector 22 may be disposed between the carrier 20 and the extending portion 11 of the circuit structure 10. The electrical connector 22 may electrically connect the circuit structure 10 and the carrier 20. In some arrangements, the electrical connector 22 may overlap the circuit structure 10 along the X direction. In some arrangements, the electrical connector 22 may overlap the extending portion 12 of the circuit structure 10 along the X direction. The electrical connector 22 may include a solder ball, such as a controlled collapse chip connection (C4) bump, a ball grid array (BGA), a land grid array (LGA), and so on. In some arrangements, the electrical connector 22 may include a solder material(s), which may include alloys of gold and tin solder or alloys of silver and tin solder, or other suitable materials.

The electronic device 1*a* may further include electrical connectors 52. The electrical connector 52 may be disposed between the antenna component 50 and the extending portion 12 of the circuit structure 10. The electrical connector 52 may electrically connect the circuit structure 10 and the antenna component 50. The electrical connector 52 may include a solder ball, such as a controlled collapse chip connection (C4) bump, a ball grid array (BGA), a land grid array (LGA), or so on. In some arrangements, the electrical connector 52 may include a solder material(s), which may include alloys of gold and tin solder or alloys of silver and tin solder, or other suitable materials.

The surface 11*s*1, the surface 12*s*1, and the bent portion 13 may define a substantially L-shaped surface 10*s*1. The surface 11*s*2, the surface 12*s*2, and the bent portion 13 may define a substantially L-shaped surface 10*s*2 opposite to the substantially L-shaped surface 10*s*1. In some arrangements, both the electronic component 30 and the antenna component 50 are disposed on the substantially L-shaped surface 10*s*2 of the circuit structure 10. In some arrangements, both the encapsulant 40 and the antenna component 50 are disposed on the substantially L-shaped surface 10*s*2 of the circuit structure 10. In some arrangements, no antenna component 50 is disposed on or attached to the substantially L-shaped surface 10*s*1. In some arrangements, a probe approaches the conductive element 64 from the side of the substantially L-shaped surface 10*s*1. Since there is more space adjacent to the substantially L-shaped surface 10*s*1, the probe can be connected to the conductive element 64 with fewer obstacles.

The carrier 20 may have a surface 20*s*3 extending between the surface 20*s*1 and surface 20*s*2. In some arrangements, the encapsulant 40 may have a surface 40*s*1 (or a lateral surface) substantially aligned with the surface 20*s*3.

In some arrangements, the electronic component 30 may be free from overlapping the antenna component 50 along the X direction. In some arrangements, the electronic component 30 may be free from overlapping the antenna component 50 along the Y direction. In some arrangements, the electronic component 30 may be free from overlapping the antenna component 50 along the Z direction.

In some arrangements, the encapsulant 40 is free from overlapping the antenna component 50 along the Y direction. In some arrangements, the encapsulant 40 is free from overlapping the antenna component 50 along the X direction. In some arrangements, the encapsulant 40 is free from overlapping the extending portion 12 of the circuit structure 10 along the Y direction. In some arrangements, the encapsulant 40 is free from overlapping the extending portion 12 of the circuit structure 10 along the X direction. In some arrangements, the surface 40*s*1 of the encapsulant 40 may exceed the extending portion 11 of the circuit structure 10. For example, the surface 40*s*1 of the encapsulant 40 may exceed the lateral surface of the extending portion 11 of the circuit structure 10.

In some arrangements, the connector 62 may overlap the circuit structure 10 along the X direction. In some arrangements, the connector 62 may overlap the extending portion 12 of the circuit structure 10 along the X direction. In some arrangements, the connector 62 may overlap the antenna component 50 along the X direction.

FIG. 2 illustrates a side view of an electronic device 1*b*, in accordance with some arrangements of the present disclosure. The electronic device 1*b* is similar to the electronic device 1*a* as shown in FIG. 1C, and the differences therebetween are described below.

In some arrangements, the electronic device 1*b* may further include a circuit structure 10'. The circuit structure 10' may include a circuit board, which includes a redistribution structure for electrical connection between components. For example, the circuit structure 10' may include a conductive layer(s), conductive trace(s), conductive pad(s), and/or conductive via(s) for electrical connection. The circuit structure 10' may include polyethylene terephthalate (PET), polyethylene naphthalate (PEN), polyimide, liquid crystal polymer (LCP), thermoplastic polyurethane (TPU), or other suitable materials. The circuit structure 10' may include a multi-layered structure, which includes dielectric layers and electrical interconnections (e.g., conductive layer, conductive trace, conductive pad, and conductive via) disposed on and/or within the dielectric layers. The circuit structure 10' may have a surface 10'*s*1 and a surface 10'*s*2 opposite to the surface 10'*s*1. In some arrangements, the surface 10'*s*1 may be a substantially flat surface. In some arrangements, the surface 10'*s*2 may be a substantially flat surface. In some arrangements, the encapsulant 40 may be disposed on or over the surface 10'*s*2 of the circuit structure 10'. In some arrangements, a portion of the carrier 20 is free from overlapping the circuit structure 10' along the Y direction. In some arrangements, the antenna component 50 may be disposed on or over the surface 10'*s*2 of the circuit structure 10'. In some arrangements, the carrier 20 may overlap the antenna component 50 along the X direction. In some arrangements, the encapsulant 40 may overlap the antenna component 50 along the X direction. In some arrangements, a probe is connected to the conductive element 64 from the side of the surface 10'*s*1. Since there is more space adjacent to the surface 10'*s*1, the probe can be connected to the conductive element 64 with fewer obstacles. In some arrangements, when the conductive element 64 and the electronic component 30 which is encapsulated by the encapsulant 40 are disposed on two opposite sides of the carrier 20, a common probe can be utilized without requiring any additional design modifications of an electronic device. As a result, the cost for probes can be reduced.

Figure 3:
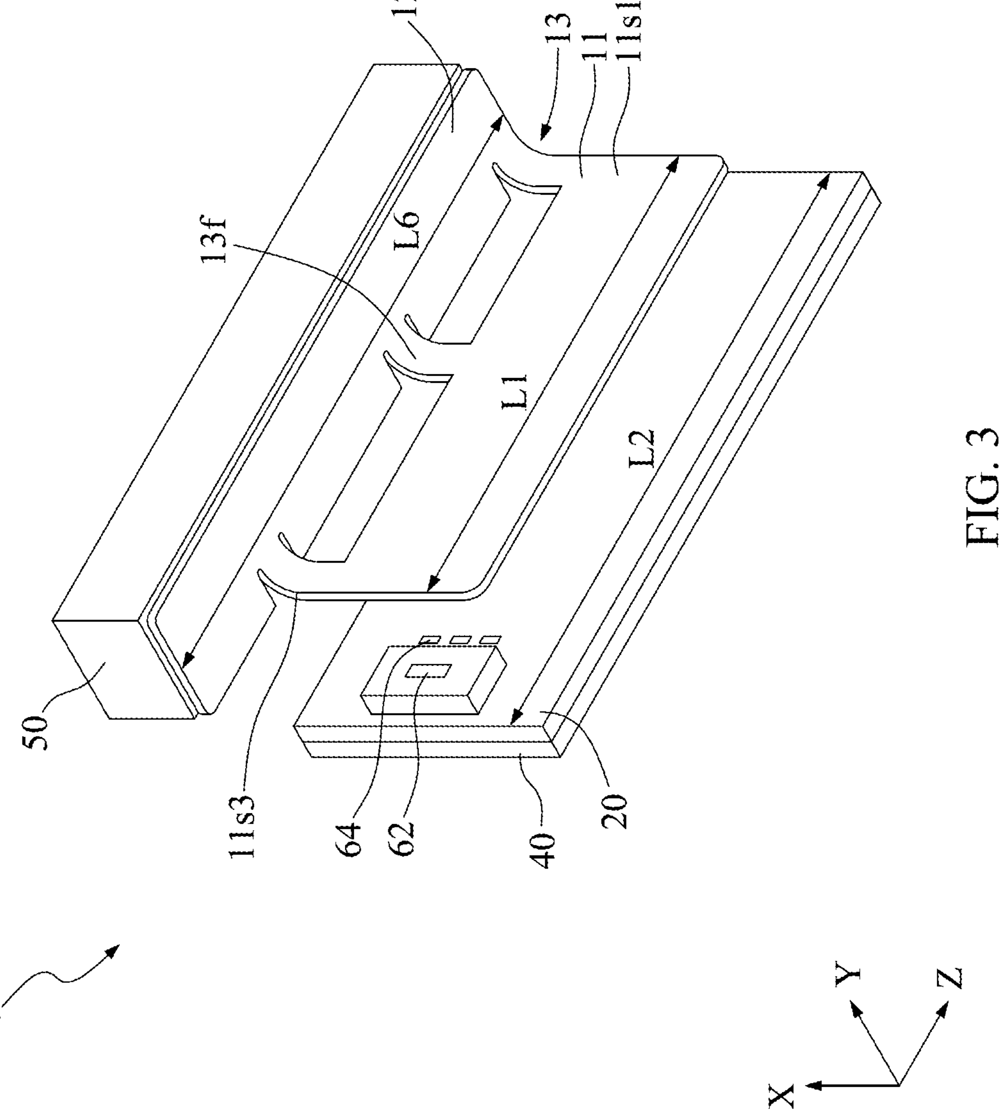
FIG. 3 illustrates a perspective view of an electronic device, in accordance with some arrangements of the present disclosure.

FIG. 3 illustrates a perspective view of an electronic device 1*c*, in accordance with some arrangements of the present disclosure. The electronic device 1*c* is similar to the electronic device 1*a* as shown in FIG. 1A, and the differences therebetween are described below.

In some arrangements, the long edge (or side) of the extending portion 12 may have a length L6 along the Z direction. In some arrangements, the length L6 of the extending portion 12 may be substantially equal to the length L2 of the carrier 20. In some arrangements, the length L6 of the extending portion 12 may be greater than the length L1 of the extending portion 11. The length of the extending portion 12 may be controlled. In some arrangements, the extending portion 12 may exceed the surface 11*s*3 of the extending portion 11. The dimension (e.g., surface area) of the antenna component 50 may be increased. For example, the amount of antenna patterns (e.g., antenna arrays) of the antenna component 50 may be increased, which thereby improves the gain of antenna. The electrical properties of the antenna component 50 may also be controlled based on the requirements of the electronic device 1*c*.

Figure 4:
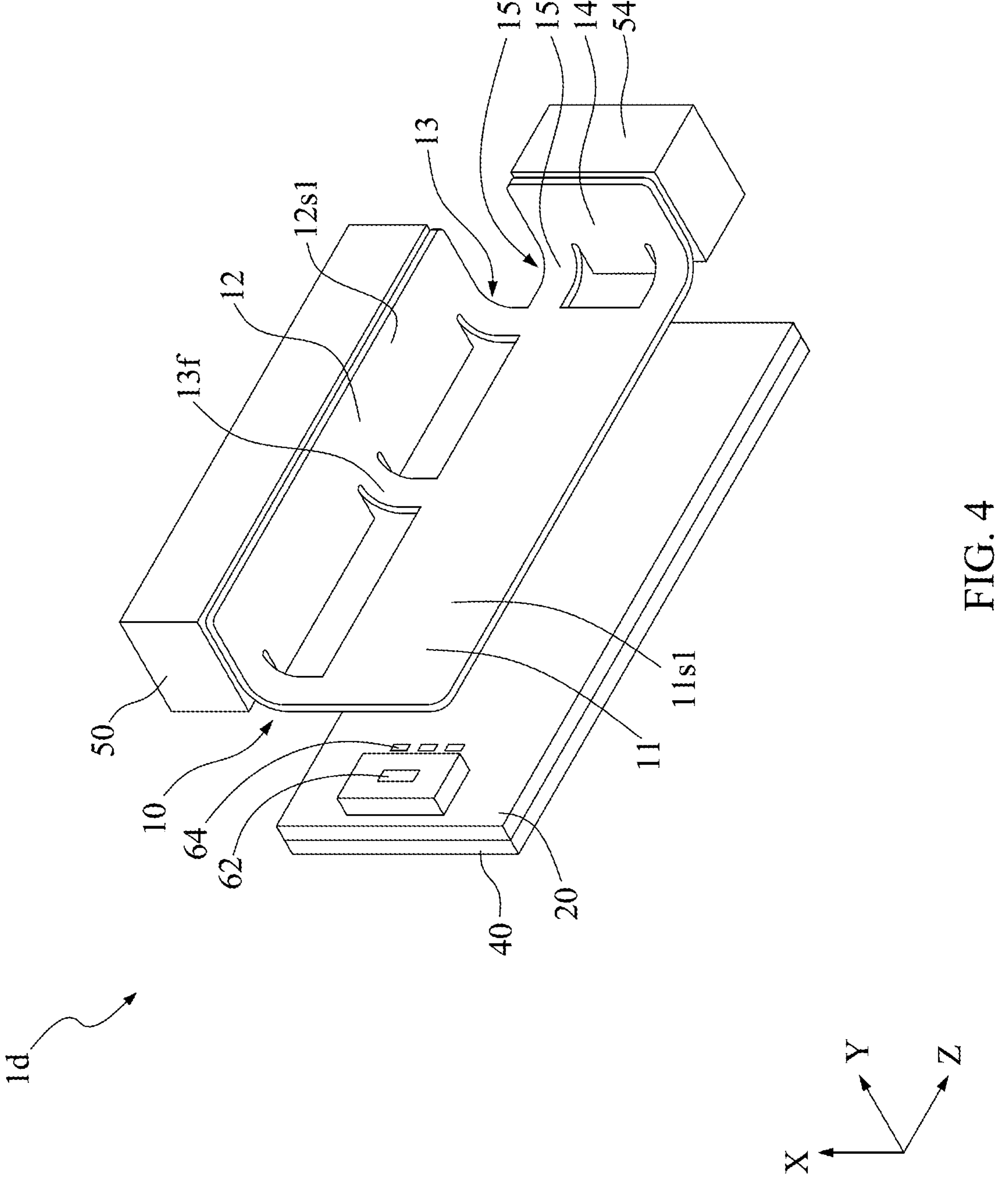
FIG. 4 illustrates a perspective view of an electronic device, in accordance with some arrangements of the present disclosure.

FIG. 4 illustrates a perspective view of an electronic device 1*d*, in accordance with some arrangements of the present disclosure. The electronic device 1*d* is similar to the electronic device 1*a* as shown in FIG. 1A, and the differences therebetween are described below.

In some arrangements, the circuit structure 10 may further include an extending portion 14 and a bent portion 15. In some arrangements, the extending portion 14 may be connected to the extending portion 11 by the bent portion 15. The extending portion 14 may extend along the X direction and the Z direction, which span a plane substantially parallel to the X-Z plane. For example, the long edge (or long side) of the extending portion 14 may substantially extend along the X direction, while the short edge (or short side) of the extending portion 14 substantially extends along the Z direction.

The bent portion 15 may extend between the extending portion 11 and extending portion 14. In some arrangements, the bent portion 15 may include two or more fingers 15*f* which are bent. In some arrangements, the finger 15*f* defines a curved surface connecting the extending portion 11 and extending portion 14. The bent portion 15 allows the extending portion 14 to extend further away from the carrier 20.

The electronic device 1*d* may further include an antenna component 54. In some arrangements, the antenna component 54 may be disposed on the extending portion 14. In some arrangements, the antenna component 54 may be configured to radiate and/or receive electromagnetic signals, such as RF signals. In some arrangements, the antenna component 54 may support fifth generation (5G) communications, such as Sub-6 GHz frequency bands and/or millimeter (mm) wave frequency bands. For example, the antenna component 50 may incorporate both Sub-6 GHz antennas and mm wave antennas. In some arrangements, the antenna component 54 may support beyond-5G or 6G communications, such as terahertz (THz) frequency bands. In some arrangements, the antenna component 54 may be detachable. For example, the antenna component 54 may be separated from the extending portion 14. In some arrangements, the antenna component 50 and antenna component 54 may be operated in different bands of frequency. In some arrangements, the antenna component 50 and antenna component 54 may be operated in different bandwidths. In some arrangements, the signal from the antenna component 50 may be incident along a direction different from that from the antenna component 54. For example, the signal (or electromagnetic wave) from the antenna component 50 may be incident substantially along the X direction which is substantially parallel to the surface 20*s*1 of the carrier 20, while the signal (or electromagnetic wave) from the antenna component 54 may be incident substantially along the Z direction. The antenna component 50 may face the X direction, while the antenna component 50 may face the Z direction.

Figure 5:
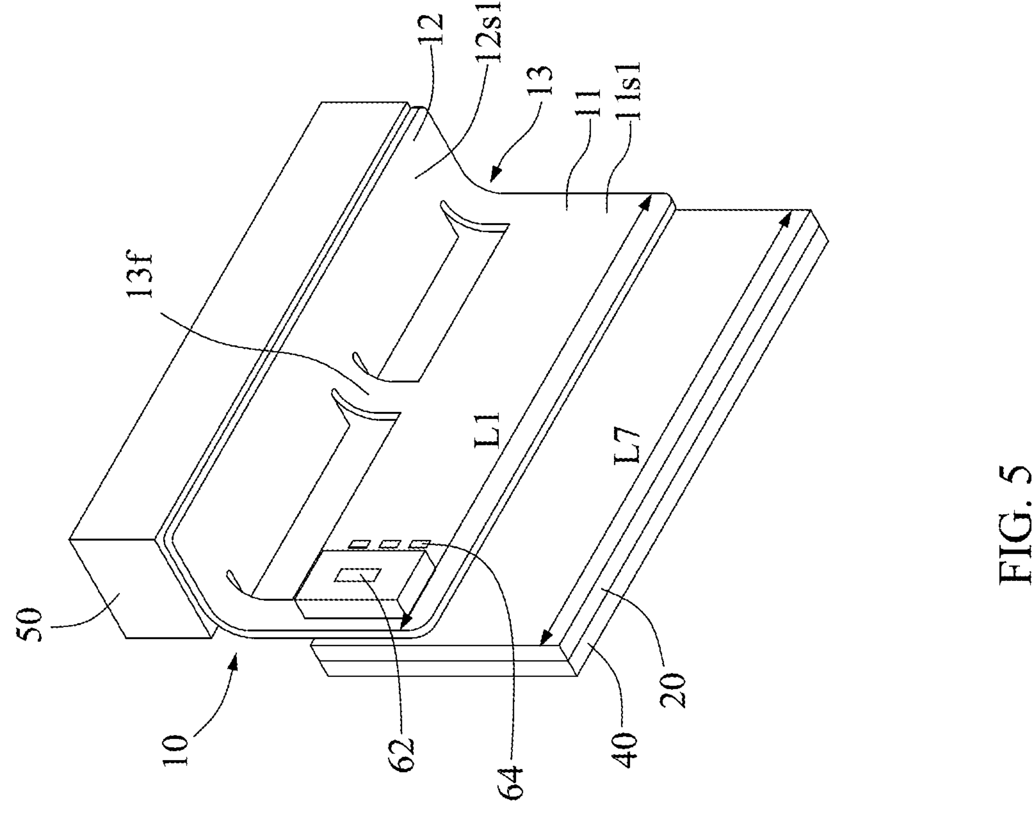
FIG. 5 illustrates a perspective view of an electronic device, in accordance with some arrangements of the present disclosure.
Figure 5:
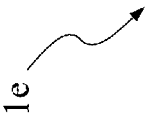
Figure 5:
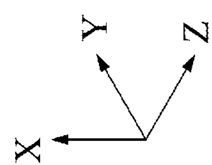

FIG. 5 illustrates a perspective view of an electronic device 1*e*, in accordance with some arrangements of the present disclosure. The electronic device 1*e* is similar to the electronic device 1*a* as shown in FIG. 1A, and the differences therebetween are described below.

In some arrangements, the long edge (or side) of the carrier 20 may have a length L7 along the Z direction. In some arrangements, the length L7 of the carrier 20 may be substantially equal to the length L1 of the carrier 20. In some arrangements, the connector 62 may be disposed on the surface 11*s*1 of the extending portion 11. The connector 62 may overlap the extending portion 11 along the Y direction. In some arrangements, the connector 62 may overlap the extending portion 12 along the X direction. In some arrangements, the connector 62 may be spaced apart from the carrier 20 by the extending portion 11 of the circuit structure 10.

In some arrangements, the conductive element 64 may be disposed on the surface 11*s*1 of the extending portion 11. In some arrangements, the conductive element 64 may be at least partially embedded within the extending portion 11 of the circuit structure 10. The conductive element 64 may overlap the extending portion 11 along the Y direction. In some arrangements, the conductive element 64 may overlap the extending portion 12 along the X direction. In some arrangements, the conductive element 64 may be spaced apart from the carrier 20 by the extending portion 11 of the circuit structure 10. In this arrangement, the dimension along the Z direction may be reduced. Therefore, the size of the electronic device 1*e* may be reduced. In this arrangement, the connector 62 may be electrically connected to the electronic component 30 through the extending portion 11 and the carrier 20. The conductive element 64 may be electrically connected to the electronic component 30 through the extending portion 11 and the carrier 20.

Figure 6:
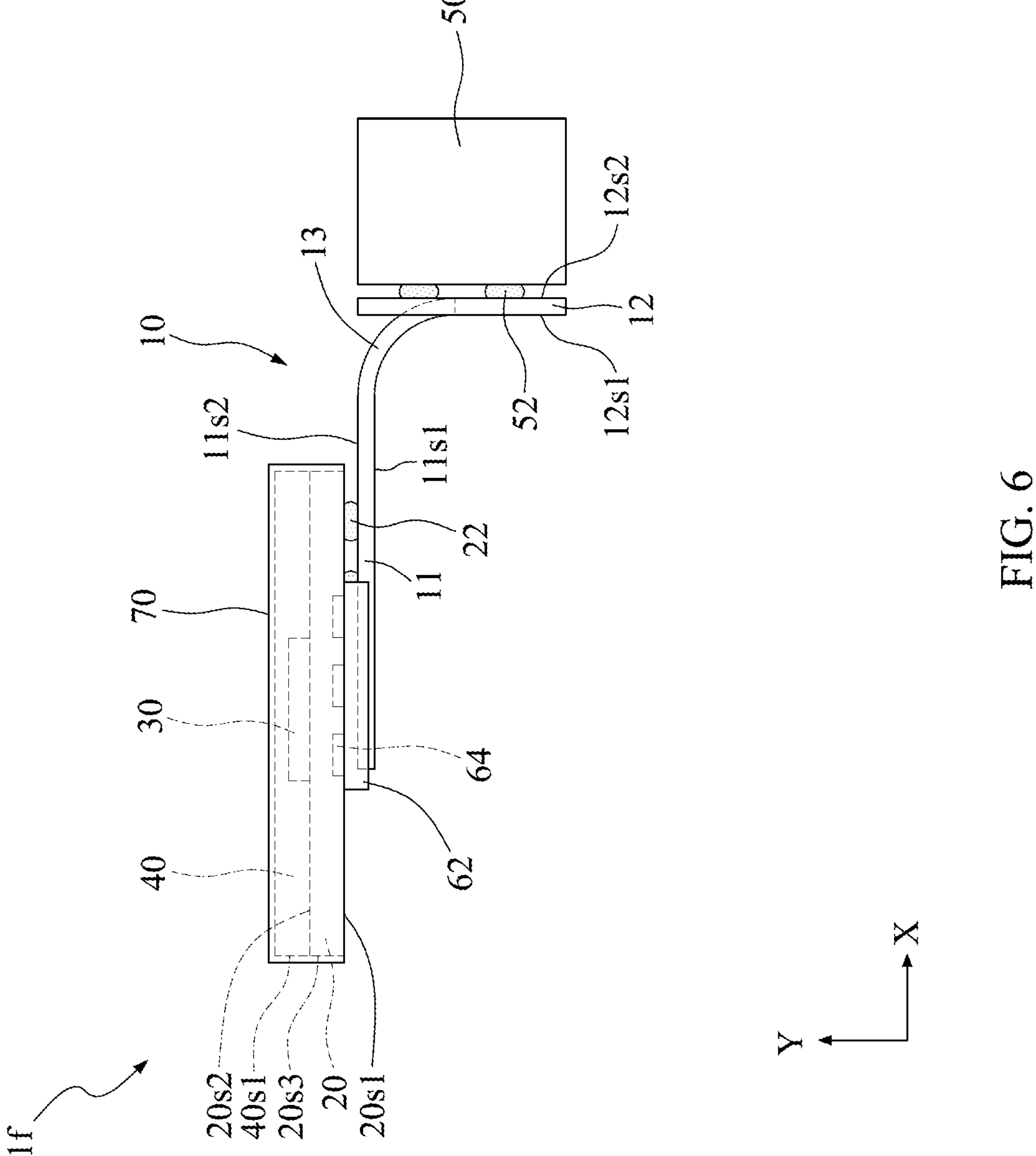
FIG. 6 illustrates a side view of an electronic device, in accordance with some arrangements of the present disclosure.

FIG. 6 illustrates a side view of an electronic device 1*f*, in accordance with some arrangements of the present disclosure. The electronic device 1*f* is similar to the electronic device 1*a* as shown in FIG. 1C, and the differences therebetween are described below.

In some arrangements, the electronic device If may further include an electromagnetic interference (EMI) shielding layer 70. In some arrangements, the EMI shielding layer 70 may be electrically connected to ground. In some arrangements, the EMI shielding layer 70 may be electrically connected to the ground trace (not shown) within the carrier 20. In some arrangements, the EMI shielding layer 70 may be configured to receive and/or transmit a ground signal. In some arrangements, the EMI shielding layer 70 may be configured to prevent the electronic component 30 from experiencing EMI. The EMI shielding layer 70 may encapsulate the encapsulant 40. The EMI shielding layer 70 may cover the outer surface of the encapsulant 40. For example, the EMI shielding layer 70 may cover the surface 40*s*1 of the encapsulant 40. The EMI shielding layer 70 may encapsulate the carrier 20. The EMI shielding layer 70 may cover the outer surface of the carrier 20. For example, the EMI shielding layer 70 may cover the surface 20*s*3 of the carrier 20. The surface 20*s*1 of the carrier 20 may be exposed by the EMI shielding layer 70.

In some arrangements, the EMI shielding layer 70 may include a multilayered structure. For example, the EMI shielding layer 70 may include an adhesion metal layer, one or more intervening metal layers, and a protection metal layer. The intervening metal layer(s) may be sandwiched by the adhesion metal layer and protection metal layer. The adhesion metal layer may have relatively good adhesion to the encapsulant 40 (or carrier 20) to prevent the EMI shielding layer 70 from peeling off from the encapsulant 40 (or carrier 20). The adhesion metal layer may include, for example, stainless steel or other suitable materials. The intervening metal layer may have relatively good ductility and shield ability to block interfering signals (e.g., light or other optical signals) in the surrounding environment from the electronic components (e.g., the electronic component 30). The intervening metal layer may include, for example, copper or other suitable materials. The protection metal layer may be configured to protect the intervening metal layer from oxidation. The protection metal layer may include, for example, stainless steel or other suitable materials.

Figure 7B:
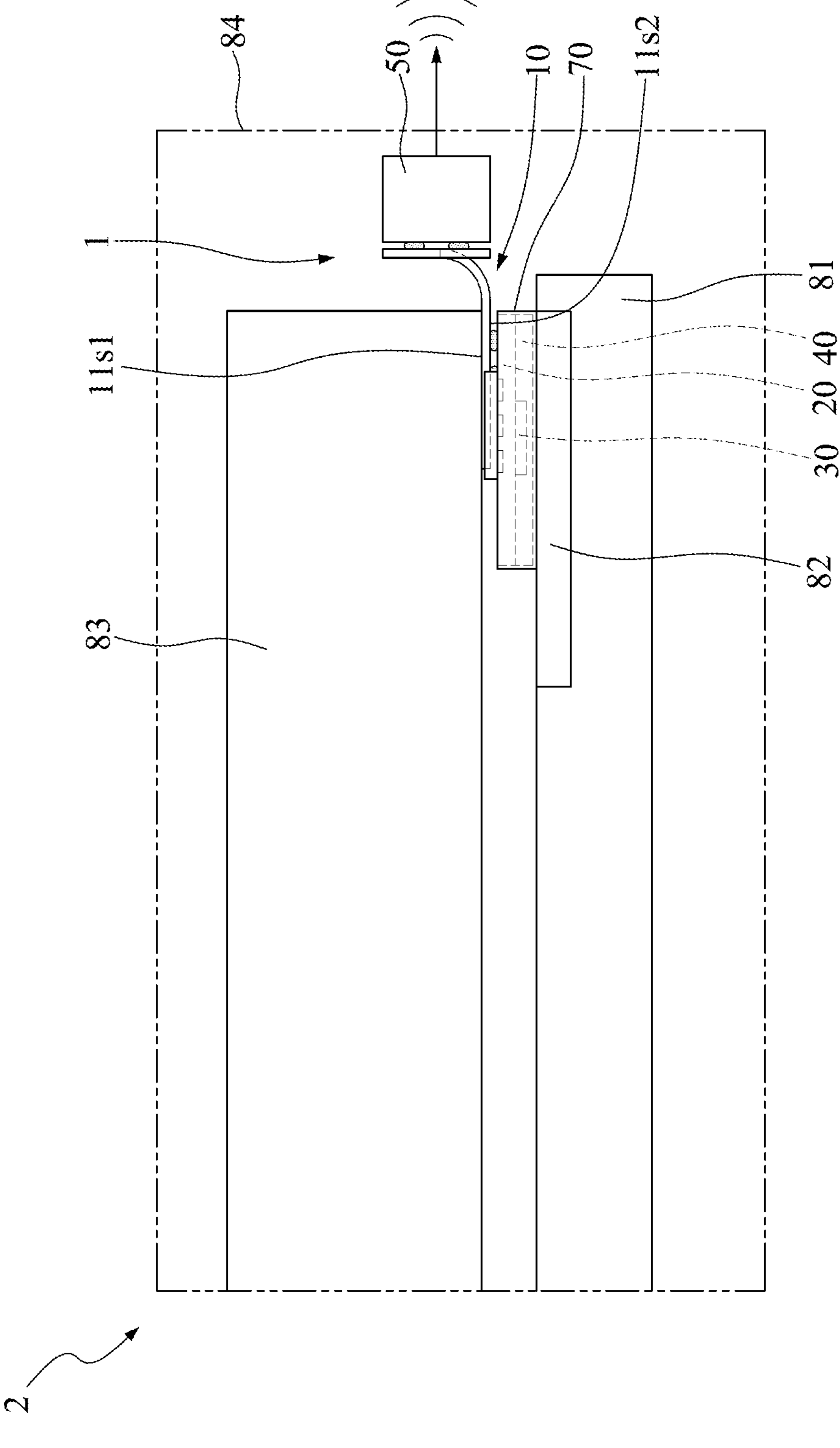
FIG. 7B illustrates a side view of the electronic device as shown in FIG. 7A, in accordance with some arrangements of the present disclosure.

FIG. 7A and FIG. 7B illustrate an electronic device 2 in accordance with some arrangements of the present disclosure, wherein FIG. 7A illustrates a layout, and FIG. 7B is a side view of FIG. 7A. In some arrangements, the electronic device 2 may include a mobile phone, a smartphone, a laptop, a digital broadcasting terminal, a personal digital assistant (PDA), a portable multimedia player (PMP), a navigation system, a slate PC, a tablet, an Ultrabook, a digital TV, a desktop computer, or the like. However, it should be noted that the configuration according to the arrangements described herein is applicable even to a new product that will be developed later. In some arrangements, the electronic device 2 may include an antenna module 1, a motherboard 81, an energy storage component 83, and a housing 84.

The antenna module 1 may be configured to transmit, receive, and/or process electromagnetic signals, such as RF signals. In some arrangements, the antenna module 1 may be the same as or similar to the electronic device 1*f* as shown in FIG. 6. For example, the antenna module 1 may include the circuit structure 10, the carrier 20, the electronic component 30, the encapsulant 40, the antenna component 50, and the EMI shielding layer 70 as shown in FIG. 6. In some arrangements, the antenna module 1 may be disposed adjacent to the edge (or lateral surface) of the housing 84. The antenna module 1 (or antenna component 50) may be configured to radiate an electromagnetic wave (or a signal) into the surrounding environment. The antenna module 1 (or antenna component 50) protrudes from the lateral surface of the motherboard 81. The antenna module 1 (or antenna component 50) may be configured to emit a signal (or electromagnetic wave) along a direction substantially perpendicular to the lateral surface of the motherboard 81.

The motherboard 81 (or a printed circuit board) may be attached to or electrically connected to the antenna module 1. In some arrangements, the motherboard 81 may include one or more active components (not shown) and passive components (not shown). The active component may include a semiconductor die or a chip, such as a logic die (e.g., application processor (AP), system-on-a-chip (SoC), central processing unit (CPU), graphics processing unit (GPU), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies) or other active components. The passive component may include a resistor, capacitor, inductor, or a combination thereof. Further, the motherboard 81 may include electrical interconnections, such as conductive trace or vias, for electrical connection.

In some arrangements, the motherboard 81 may include a heat dissipating element 82. The heat dissipating element 82 may be attached to or connected to the EMI shielding layer 70 of the antenna module 1. In some arrangements, a thermal conductive material (not shown) may be disposed between the encapsulant 40 and the heat dissipating element 82. The heat dissipating element 82 may be configured to receive and/or transmit heat emitted from the antenna module 1. A heat dissipation path may be provided between the antenna module 1 and the motherboard 81. The heat dissipation element 82 may include copper, silver, gold, or other suitable thermally conductive materials.

The energy storage component 83 may be disposed on or attached to the surface 11*s*2 of the circuit structure 10. The energy storage component 83 may include a battery, which may be configured to provide the antenna module 1 or other devices with power. In some arrangements, the antenna module 1 may be disposed between the motherboard 81 and energy storage component 83.

The housing 84 may accommodate the antenna module 1, the motherboard 81, and the energy storage component 83. The energy storage component 83 may be formed of plastic, glass, ceramics, fiber composites, metal (e.g., stainless steel, aluminum, etc.), other suitable materials, or a combination of any two or more of these materials. The housing 84 may be machined or molded as a single structure or may be formed using multiple structures (e.g., an internal frame structure, one or more structures that form exterior housing surfaces, or the like).

FIG. 8A to FIG. 8D illustrate multiple stages of an example of a method for manufacturing an electronic device according to some arrangements of the present disclosure.

Figure 8A:
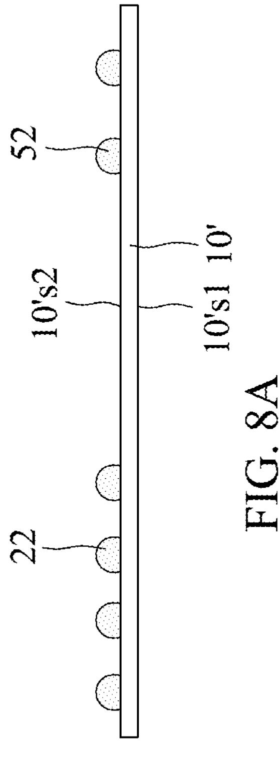
FIG. 8A illustrates one or more stages of an example of a method for manufacturing a semiconductor package structure according to some arrangements of the present disclosure.

Referring to FIG. 8A, a circuit structure 10' is provided. In some arrangements, the circuit structure 10' may be flexible. The circuit structure 10' may have a surface 10'*s*1 and a surface 10'*s*2 opposite to the surface 10'*s*1. Electrical connectors 22 may be formed on or over the surface 10'*s*2 of the circuit structure 10'. Electrical connectors 52 may be formed on or over the surface 10'*s*2 of the circuit structure 10'.

Figure 8B:
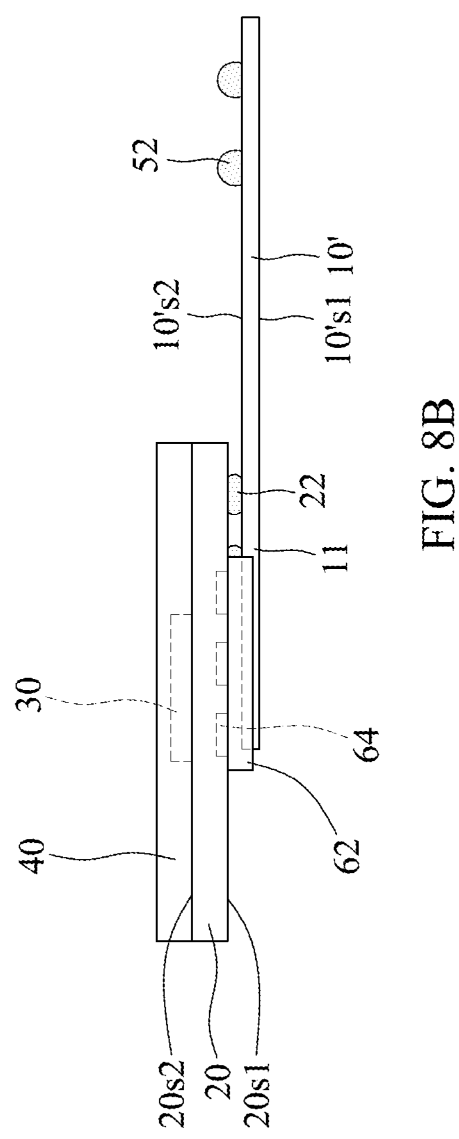
FIG. 8B illustrates one or more stages of an example of a method for manufacturing a semiconductor package structure according to some arrangements of the present disclosure.

Referring to FIG. 8B, a structure, including a carrier 20, an electronic component 30, and an encapsulant 40 encapsulating the electronic component 30, may be attached to the surface 10'*s*2 through the electrical connector 22. The carrier 20 may have a surface 20*s*1 and a surface 20*s*2 opposite to the surface 20*s*1. In some arrangements, the electronic component 30 and the encapsulant 40 may be formed on the surface 20*s*2 of the carrier 20. In some arrangements, a connector 62 may be formed on the surface 20*s*1 of the carrier 20.

Figure 8C:
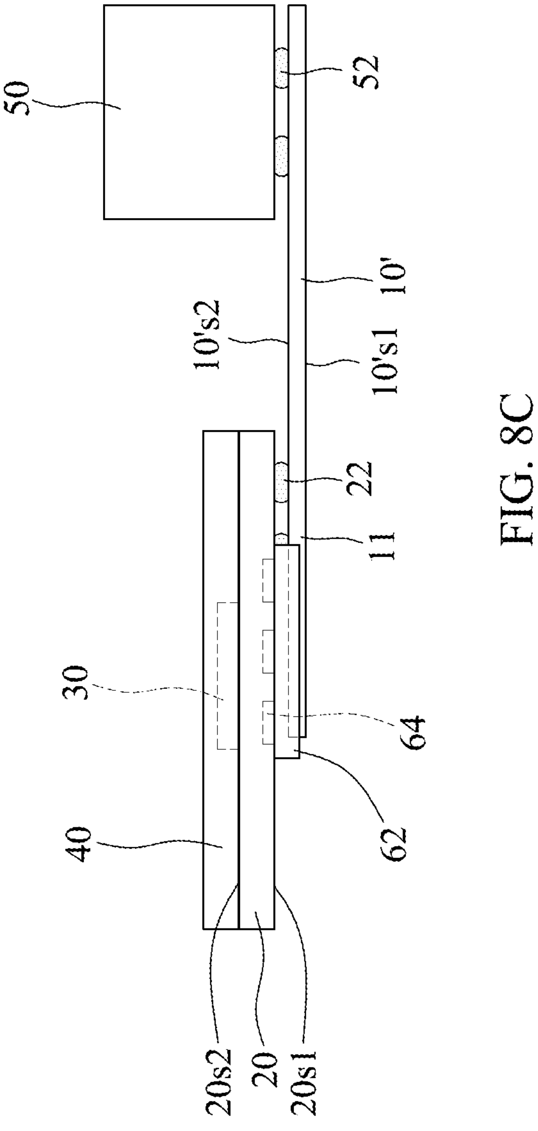
FIG. 8C illustrates one or more stages of an example of a method for manufacturing a semiconductor package structure according to some arrangements of the present disclosure.

Referring to FIG. 8C, an antenna component 50 may be attached to the surface 10'*s*2 through the electrical connector 52. In some arrangements, a reflow process may be performed. The reflow process may be configured to activate solder-assisting solvent such that the solder-assisting solvent may assist in attaching the electrical connector 52 and electrical connector 22 to the terminals of the antenna component 50 and the carrier 20, respectively.

Figure 8D:
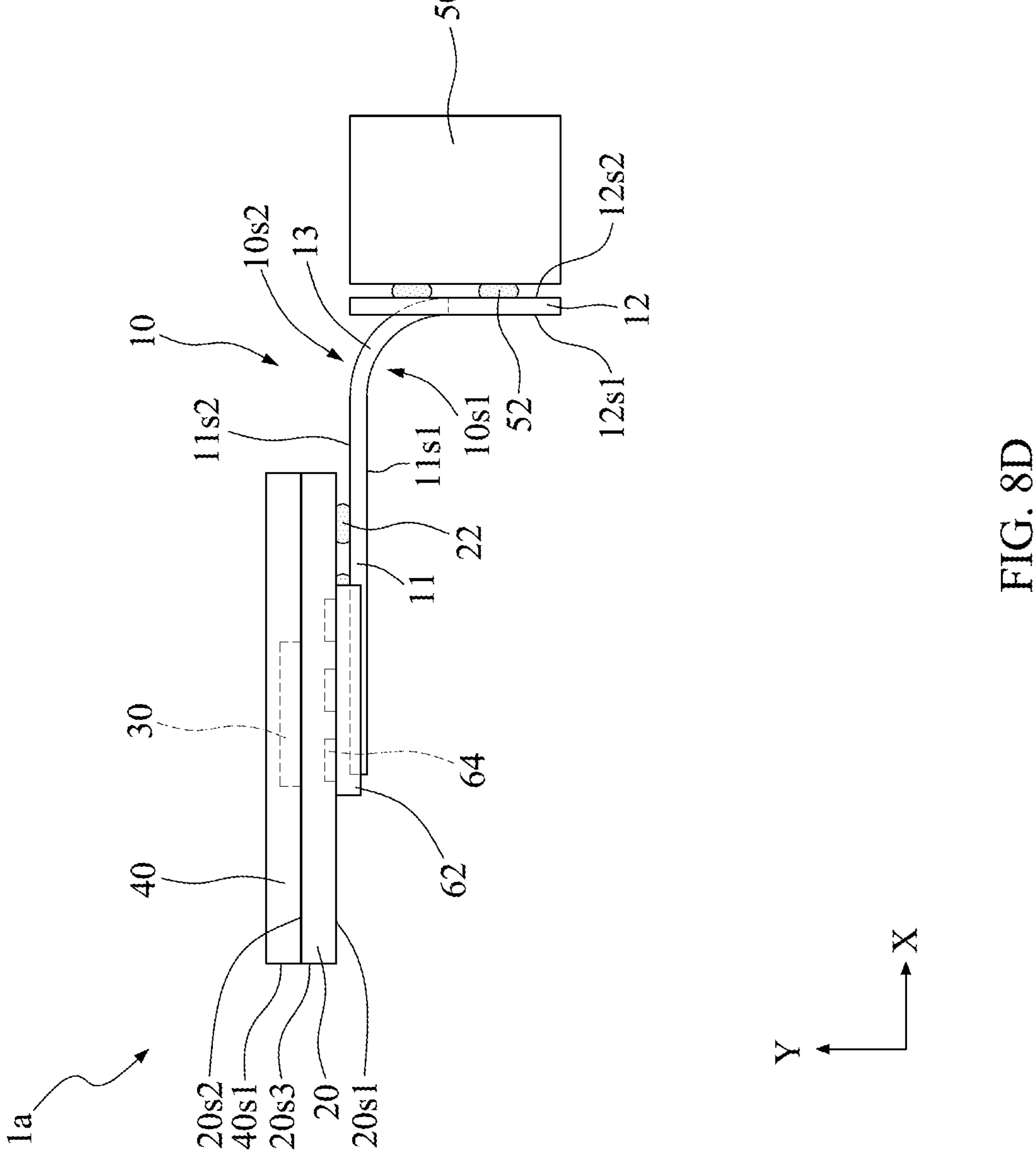
FIG. 8D illustrates one or more stages of an example of a method for manufacturing a semiconductor package structure according to some arrangements of the present disclosure.

Referring to FIG. 8D, the circuit structure 10' may be bent to define the circuit structure 10, which may include substantially L-shaped surfaces 10*s*1 and 10*s*2. The electronic component 30 and the antenna component 50 may face different sides. As a result, an electronic device (e.g., the electronic device 1*a* as shown in FIG. 1C) may be produced.

Figure 9A:
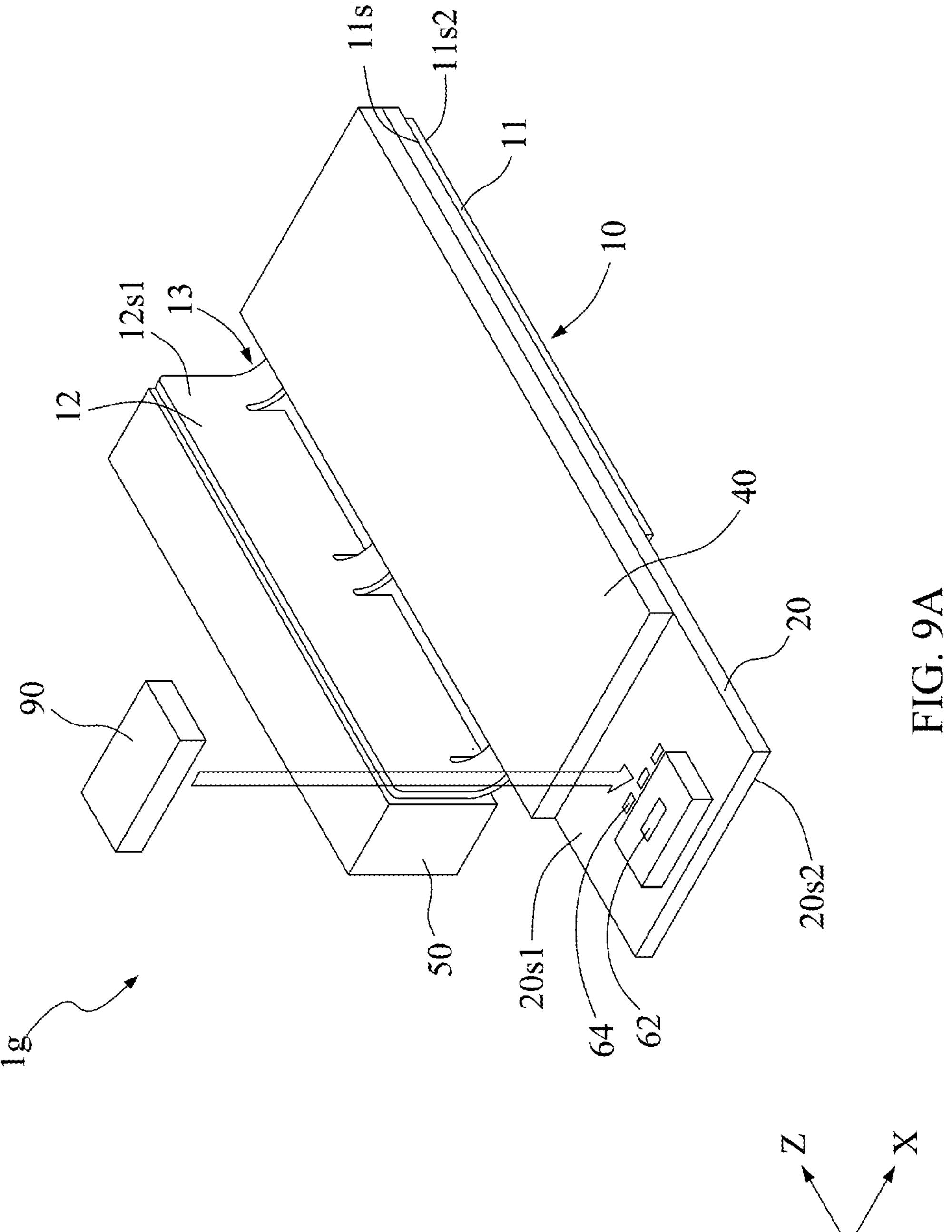
FIG. 9A illustrates a perspective view of an electronic device of a comparative arrangement during test.

FIG. 9A illustrates a perspective view of an electronic device 1*g* of a comparative arrangement during test. The carrier 20 may be disposed on the surface 11*s*1 of the extending portion 11 of the circuit structure 10. The encapsulant 40, the connector 62, and the conductive element 64 may be disposed on the surface 20*s*1 of the carrier 20. In this scenario, the presence of the encapsulant 40, which is relatively thick, may obstruct the approach of a probe 90 towards the conductive element 64 during test.

Figure 9B:
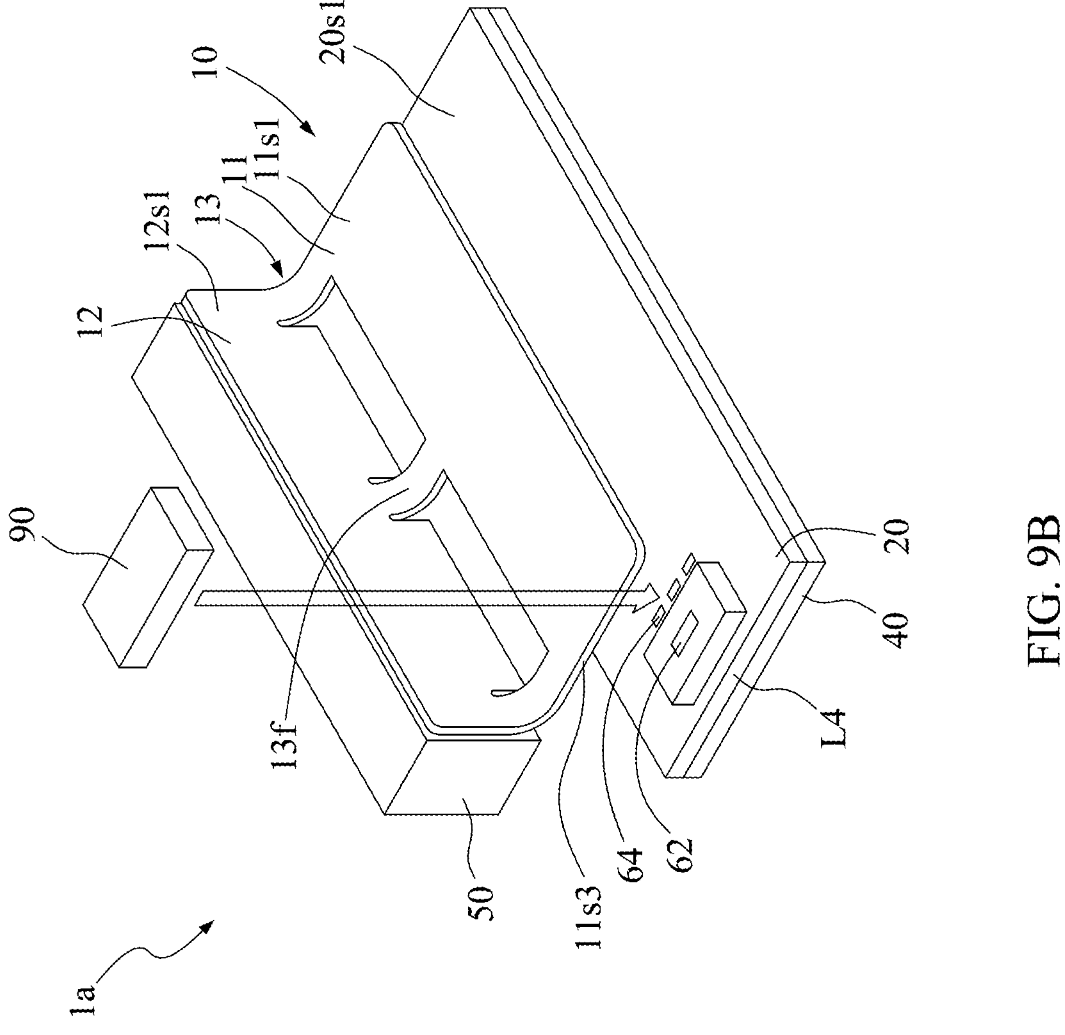
FIG. 9B illustrates a perspective view of an electronic device, in accordance with some arrangements of the present disclosure during test.
Figure 9B:
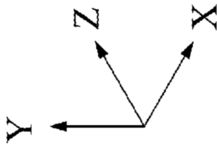

FIG. 9B illustrates a perspective view of the electronic device 1*a* during test, in accordance with some arrangements of the present disclosure. Since the encapsulant 40 and the conductive element 64 are disposed at opposite sides of the carrier 20, the probe 90 can be connected to the conductive element 64 with fewer obstacles.

In some arrangements, an electronic device includes a carrier, an electronic component, a conductive element, and a flexible circuit structure. The carrier has a first surface and a second surface opposite to the first surface. The electronic component is disposed over the second surface. The conductive element is disposed under the first surface of the carrier and electrically connected to the electronic component for testing. The flexible circuit structure is supported by the first surface of the carrier and connected to a first antenna.

In some arrangements, the conductive element is exposed by the first surface of the carrier.

In some arrangements, the conductive element is spaced apart from the carrier by the flexible circuit structure In some arrangements, the conductive element is electrically connected to the carrier through the flexible circuit structure.

In some arrangements, the conductive element is free from overlapping the flexible circuit structure along a first direction defined from the first surface toward the second surface of the carrier.

In some arrangements, a connector disposed under the first surface, wherein the conductive element is disposed between the flexible circuit structure and the connector.

In some arrangements, the conductive element overlaps the flexible circuit structure along a second direction substantially orthogonal to the first direction.

In some arrangements, an encapsulant disposed over the second surface and encapsulating the electronic component, wherein the encapsulant is free from overlapping the first antenna along the first direction.

In some arrangements, the encapsulant is free from overlapping the first antenna along a second direction substantially orthogonal to the first direction.

In some arrangements, the flexible circuit structure comprises a first extending portion substantially extending along a first direction defined from the first surface toward the second surface of the carrier, and the first antenna is supported by the first extending portion.

In some arrangements, the flexible circuit structure comprises a second extending portion substantially extending along the first direction and supporting a second antenna.

In some arrangements, the first antenna is configured to operate at a first band of frequency different from a second band of frequency of the second antenna.

In some arrangements, the first extending portion is spaced apart from the second extending portion by a bent portion.

In some arrangements, the carrier has a first length along a first direction substantially orthogonal to a second direction defined by the first surface toward the second surface of the carrier, the flexible circuit structure and a second length along the first direction, and the second length is less than the first length.

In some arrangements, an electronic device includes a carrier, a flexible circuit structure, and a connector. The carrier has a first surface and a second surface opposite to the first surface. The flexible circuit structure is disposed under the first surface of the carrier and supports an antenna. The connector is disposed under the first surface of the carrier. The connector faces a first direction, and the flexible circuit structure faces a second direction different from the first direction.

In some arrangements, an electronic component disposed over the second surface of the carrier, wherein the electronic component is free from overlapping the antenna along a direction defined from the first surface toward the second surface.

In some arrangements, the flexible circuit structure comprises a first extending portion supporting the carrier and a second extending portion supporting the antenna, and the first extending portion is substantially orthogonal to the second extending portion.

In some arrangements, the flexible circuit structure further comprises a bent portion connecting the first extending portion and the second extending portion, and the first extending portion, the second extending portion, and the bent portion are formed in a one-piece.

In some arrangements, the first extending portion has a first surface area less than a second surface area of the carrier In some arrangements, a portion of the first extending portion is exposed by the carrier.

In some arrangements, an encapsulant disposed over the second surface of the carrier, wherein a lateral surface of the encapsulant exceeds a lateral surface of the first extending portion of the carrier.

In some arrangements, the first extending portion and the second extending portion collectively define a first substantially L-shaped surface, and the encapsulant and the antenna are disposed on the first substantially L-shaped surface In some arrangements, the first extending portion and the second extending portion collectively define a second substantially L-shaped surface opposite to the first substantially L-shaped surface, and no antenna is disposed on the second substantially L-shaped surface.

In some arrangements, a test pad disposed under the first surface of the carrier and abutting the connector.

In some arrangements, an electromagnetic interference (EMI) shielding layer encapsulating the carrier.

In some arrangements, the EMI shielding layer further encapsulates the encapsulant.

In some arrangements, an electronic device includes a flexible circuit structure, an electronic component, and an antenna. The flexible circuit structure has a first surface and a second surface adjacent to the first surface. The electronic component is disposed on the first surface. The antenna is disposed on the second surface.

In some arrangements, the bendable circuit structure further comprises a third surface opposite to the first surface. A connector, wherein the connector is closer to the third surface than the electronic component is.

In some arrangements, an encapsulant encapsulating the electronic component and overlapping the connector along a direction substantially orthogonal to the first surface of the bendable circuit structure.

In some arrangements, a carrier disposed between the electronic component and the bendable circuit structure, and the connector is attached to the carrier.

Spatial descriptions, such as "above," "below," "up," "left," "right," "down," "top," "bottom," "vertical," "horizontal," "side," "higher," "lower," "upper," "over," "under," and so forth are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of arrangements of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to +10% of that numerical value, such as less than or equal to +5%, less than or equal to +4%, less than or equal to +3%, less than or equal to +2%, less than or equal to +1%, less than or equal to +0.5%, less than or equal to +0.1%, or less than or equal to +0.05%. For example, two numerical values can be deemed to be "substantially" the same or equal if a difference between the values is less than or equal to +10% of an average of the values, such as less than or equal to +5%, less than or equal to +4%, less than or equal to +3%, less than or equal to +2%, less than or equal to +1%, less than or equal to +0.5%, less than or equal to +0.1%, or less than or equal to +0.05%.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the singular terms "a," and "an" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having conductivity greater than approximately 104 S/m, such as at least 105 S/m or at least 106 S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific arrangements thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other arrangements of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An electronic device, comprising:

a carrier having a first surface and a second surface opposite to the first surface;

an electronic component abutting the second surface of the carrier;

a first antenna connected with the carrier;

a conductive element abutting the first surface of the carrier and configured to test the first antenna; and a connector abutting the first surface of the carrier and configured to connect an external device to the carrier.

2. The electronic device of claim 1, further comprising a flexible circuit structure connecting the first antenna to the carrier and electrically connected to the conductive element.

3. The electronic device of claim 2, wherein the conductive element is spaced apart from the flexible circuit structure.

4. The electronic device of claim 2, wherein the conductive element is electrically connected to the carrier through the flexible circuit structure.

5. The electronic device of claim 1, wherein an electrical transmission path between the connector and the electronic component is substantially the same as an electrical transmission path between the conductive element and the electronic component.

6. The electronic device of claim 2, wherein a portion of the first surface of the carrier is not covered by the flexible circuit structure, and the connector covers the portion.

7. The electronic device of claim 1, further comprising:

an encapsulant abutting the second surface and encapsulating the electronic component, wherein the encapsulant is free from overlapping the first antenna along a direction substantially orthogonal to the second surface.

8. The electronic device of claim 2, wherein the flexible circuit structure comprises a first portion over the first surface and a second portion connected to the first portion and extending along a direction substantially orthogonal to the first surface, and wherein the first antenna is disposed over the second portion and configured to emit an electromagnetic wave along a direction substantially parallel to the first surface of the carrier.

9. The electronic device of claim 2, wherein the flexible circuit structure comprises a first portion over the first surface and a second portion connected to the first portion, the first antenna is disposed over the second portion, and the second portion of the flexible circuit structure bends towards a direction far from the electronic component.

10. The electronic device of claim 8, wherein the flexible circuit structure comprises a first bent portion and a second bent portion, each connecting the first portion to the second portion, and the first bent portion overlaps the second bent portion in a direction substantially parallel to the first surface of the carrier.

11. The electronic device of claim 1, further comprising:

a flexible circuit structure connecting the first antenna to the carrier, wherein the flexible circuit structure partially faces the first surface of the carrier and only extends along a portion of the first surface of the carrier.

12. An electronic device, comprising:

a carrier having a first surface and a second surface opposite to the first surface;

a flexible circuit structure partially facing the first surface of the carrier;

a first antenna connected to the flexible circuit structure; and a connector attached to the first surface of the carrier and electrically connected to the first antenna by the flexible circuit structure, wherein the connector is configured to connect an external device to the carrier.

13. The electronic device of claim 12, further comprising;

an electronic component abutting the second surface of the carrier, wherein the electronic component is free from overlapping the first antenna along a direction substantially orthogonal to a surface of the carrier supporting the connector.

14. The electronic device of claim 12, further comprising:

an electronic component abutting the second surface of the carrier; and a second antenna connected to the flexible circuit structure, wherein the first antenna and the second antenna are configured to emit electromagnetic waves along different directions, and the electronic component is free from overlapping the first antenna and the second antenna along a direction substantially parallel to a surface of the carrier supporting the connector.

15. The electronic device of claim 12, wherein the connector is disposed within a space defined by the flexible circuit structure and the carrier.

16. The electronic device of claim 12, wherein a first length of the carrier is greater than a second length of the flexible circuit structure along a first direction, and a third length of the carrier is greater than a fourth length of the flexible circuit structure along a second direction substantially orthogonal to the first direction.

17. The electronic device of claim 12, wherein the connector is electrically connected to the first antenna by the carrier.

18. An electronic device, comprising:

a carrier having a first surface and a second surface opposite to the first surface;

an electronic component abutting the second surface of the carrier;

a connector abutting the first surface of the carrier and configured to connect the carrier to an external device; and a bendable circuit layer connecting an antenna to the carrier and spaced apart from the connector, wherein the bendable circuit layer is partially facing the first surface of the carrier and only extends along a portion of the first surface of the carrier.

19. The electronic device of claim 18, wherein the electronic component is configured to face a printed circuit board, and a heat dissipation path is provided between the electronic component and the printed circuit board.

20. The electronic device of claim 19, wherein the antenna protrudes from a lateral surface of the printed circuit board and configured to emit an electromagnetic wave along a direction substantially perpendicular to the lateral surface of the printed circuit board.

* * * * *